United States Patent [19]

Athey

[11] 3,829,741

[45] Aug. 13, 1974

[54] MOUNTING FOR PRINTED CIRCUIT BOARDS

[75] Inventor: Stuart E. Athey, Troy, Ohio

[73] Assignee: The Hobart Manufacturing Company, Troy, Ohio

[22] Filed: Jan. 15, 1973

[21] Appl. No.: 323,538

[52] U.S. Cl. .......... 317/101 DH
[51] Int. Cl. .......... H02b 1/02
[58] Field of Search .......... 317/101 DH

[56] References Cited

UNITED STATES PATENTS

| | | | |
|---|---|---|---|
| 3,216,580 | 11/1965 | Fricker, Jr. | 317/101 DH |
| 3,652,899 | 3/1972 | Henschen | 317/101 DH |

*Primary Examiner*—David Smith, Jr.
*Attorney, Agent, or Firm*—Biebel, French & Bugg

[57] ABSTRACT

A mother printed circuit board is supported in spaced parallel relation to a metal base plate by a plurality of unitary plastic support stands. The stands have lower ends which are keyed onto the base plate, with integral locking fingers which extend outwardly above corresponding apertures formed in the mother board providing ease of assembly of the mother board onto the support base without the necessity for using fasteners or mounting screws. The same support stands are provided with vertically extending guides and locking arms for retaining a daughter board in perpendicular relation to the mother board again without the use of fasteners or mounting screws. In practice, a plurality of pairs of support stands may be used with a single mother board to permit insertion of a corresponding plurality of daughter boards.

3 Claims, 14 Drawing Figures

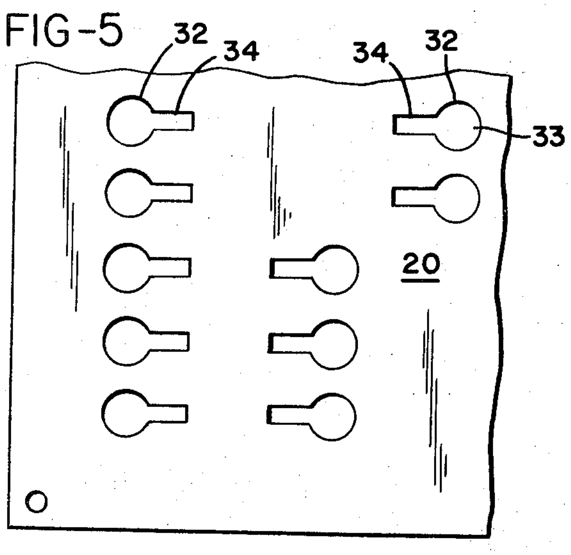
FIG-6, FIG-7
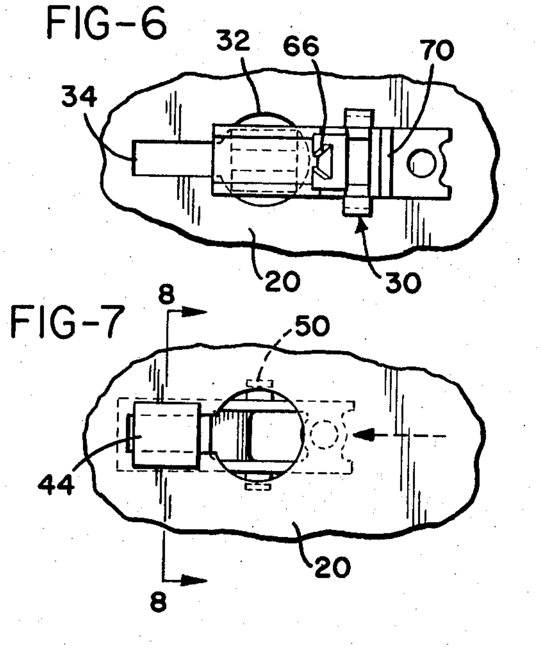
FIG-8, FIG-9, FIG-10
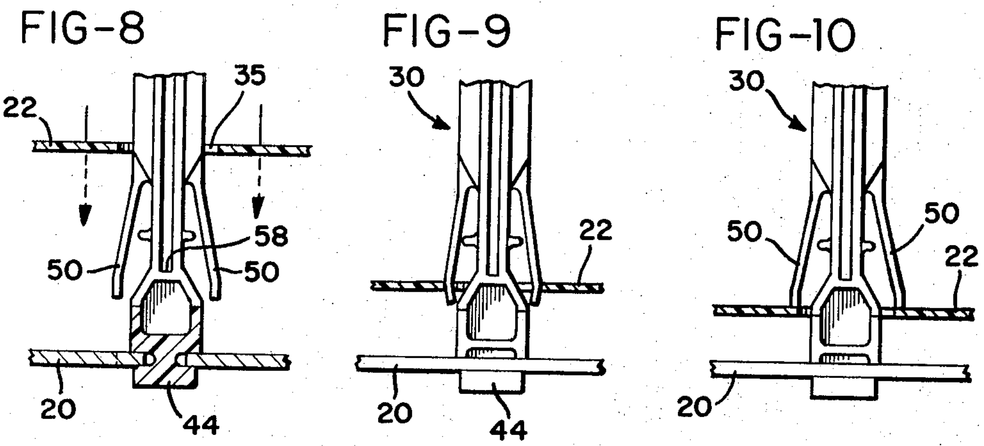
FIG-11, FIG-12, FIG-13, FIG-14
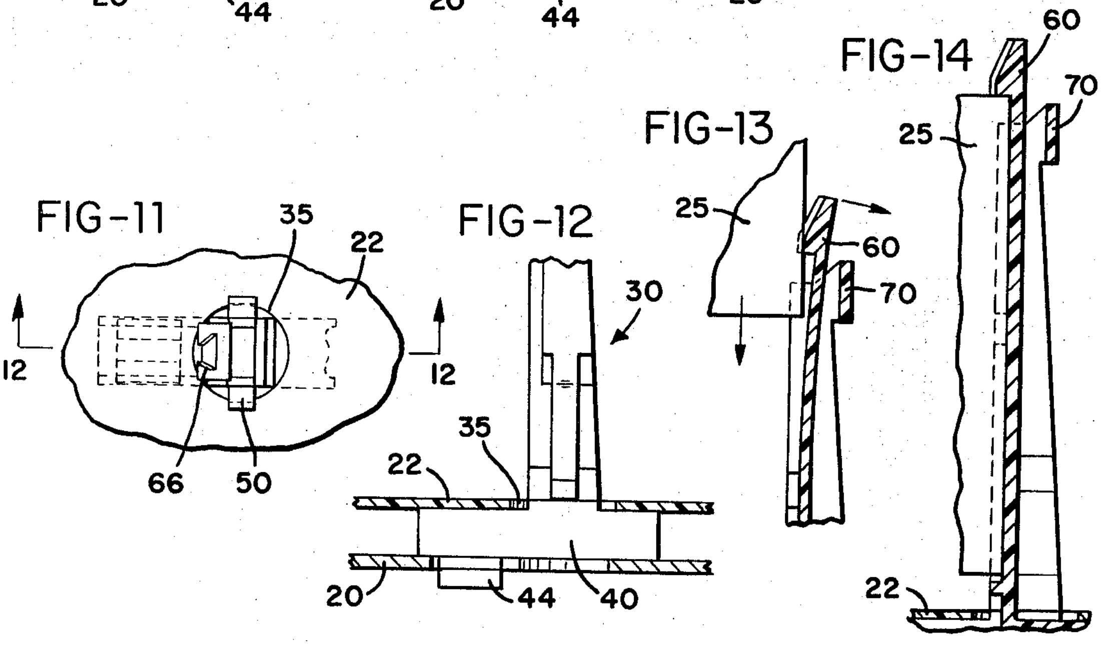

MOUNTING FOR PRINTED CIRCUIT BOARDS

BACKGROUND OF THE INVENTION

In the art of printed circuit boards there often exists a need for a primary board, sometimes called a "mother" board, which contains the required basic circuitry and connections, together with one or more secondary or "daughter" boards which contain specific circuitry to provide particular functions to the circuits of the mother board. It is highly desirable that these boards be mounted in the chassis in such a manner that their proper assembly is not left to chance, that the proper alignments of the mother to the panel and the daughter board to the mother board are assured, and that the boards may be readily inserted and easily removed for function changing or servicing without the necessity of removing or inserting fasteners or mounting screws.

SUMMARY OF THE INVENTION

The invention relates to printed circuit boards and to supports therefor, and more particularly to a system of mother-daughter boards and to an arrangement for supporting these boards relative to each other and to a base plate.

In the practice of the present invention, a rigid base plate, which may be made of painted metal, is formed with a plurality of key-shaped openings for receiving the base of a circuit board support stand. A separate stand is used for each opening and provides means by which a mother board is supported in parallel spaced stand-off relation to the base plate. The support stands also provide the means by which one or more daughter boards are supported in normal or perpendicular relation to the mother board, or the daughter board (or one of them) can be supported perpendicular to and engaged with an edge connector mounted in some way other than on a mother board.

The support stands of the present invention provide several useful functions. First, they provide a means of assembling the mother board onto the base plate without the use of fasteners or mounting screws. Second, they provide an insulated stand-off of the mother board from the base plate. Third, pairs of the support stands are aligned so as to support individual daughter boards on the mother board. Both the daughter and mother boards are supported and retained without the use of fasteners or mounting screws.

The apparatus has several important advantages. The support stands are self-aligning on the base thereby providing for ease of insertion of the mother board. The support stands are provided with automatic locking fingers. The mother board is provided with apertures which slide down over the fingers, automatically locking the mother board in a stand-off relation on the insulated base portions of the upright stands. The assembly is one which can readily be accomplished without error and without damage to the mother board.

The support stands also include integral vertical guides which engage the corresponding vertical edges of the daughter boards so that these boards are readily guided into place when they are inserted. The stands are further provided with automatic daughter board locking means in the form of spring arms which engage the top edge of these boards and retain them firmly in place. Preferably, an electrical edge connector is employed between the mother and daughter boards so that connection is made when the daughter board is inserted on the support stands.

It is accordingly an important object of the invention to provide a fastenerless means of supporting mother and daughter boards in relation to a base plate; to provide a unitary support member, as outlined above; and to provide a combination of a base plate, a mother board, one or more daughter boards and support stands therefor which are particularly adapted for ease of production, assembly and servicing.

These and other objects and advantages of the invention will be apparent from the following description, the accompanying drawings and the appended claims.

BRIEF DESCRIPTION OF THE DRAWINGS

FIG. 5 is a plan view of a typical base plate;

FIG. 6 is a top plan view of a stand being inserted in a base plate;

FIG. 7 is a bottom plan view similar to FIG. 6 after the bottom shoe has been inserted in the keyway;

FIG. 8 is an enlarged vertical fragmentary section taken generally along the line 8—8 of FIG. 7 showing the mother board in the first stage of being inserted in place;

FIG. 9 is a view similar to FIG. 8 showing the mother board passing over the fingers;

FIG. 10 is another view similar to FIG. 8 showing the mother board secured on the base support surface;

FIG. 11 is a top plan view of the support stand with the mother board in place;

FIG. 12 is a vertical fragmentary section taken generally along the line 12—12 of FIG. 11;

FIG. 13 is a fragmentary detail showing the daughter board being inserted on one of the stands; and FIG. 14 shows the daughter board after it has been locked in place.

DESCRIPTION OF THE PREFERRED EMBODIMENT

Figure 1:
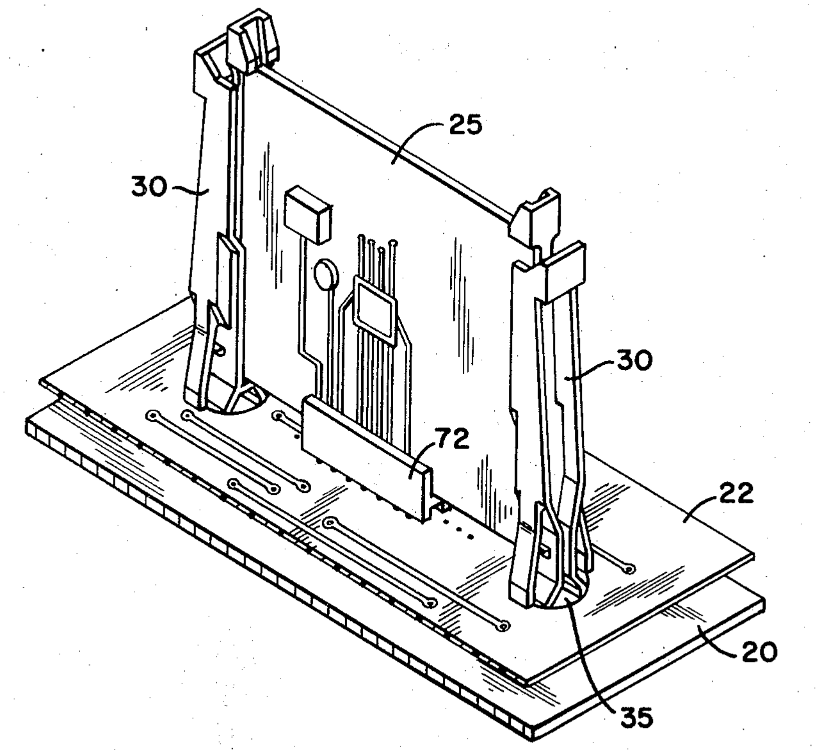
FIG. 1 is a perspective view showing a pair of stands supporting a daughter board on a mother board.

A printed circuit board combination, according to this invention, is illustrated in FIG. 1 as including a metal support base 20, a printed circuit mother board 22, a printed circuit daughter board 25, and a pair of identical mounting or support stands 30. For the purpose of this invention, the support base 20 is preferably provided with a plurality of pairs of keyhole-shaped openings 32 as shown in FIG. 5. The openings 32 thus include a circular portion 33 and an offset slotted portion or keyway 34. The mother board 22 is provided with a plurality of circular mounting openings 35 therein corresponding in number and in spacing to the openings 32 in the base 20.

The support stands 30 are formed of a high impact resistant and fire resistant plastic material, such as glass filled ABS, and include a base portion 40 adapted to be mounted on the support base 20, and further have an upstanding body portion 42 extending substantially vertically from the base 40. The lower surface of the base 40 is provided with a slotted shoe 44, the shoe being offset laterally from the body portion 42 in the same manner that the keyway 34 is offset from the opening 33. The shoe 44 is proportioned to be received through the opening 33 and to engage the keyway 34 as shown in FIGS. 6 and 7, thus providing means for mounting the support stands 30 on the base plates 20. The keyway or slot 34 is longer than the shoe 44 and is somewhat wider than the web 45 by which the shoe is attached to the base 40, thus providing for limited lateral and transverse adjusting movement of the stands 30 with respect to the base 20.

The base portion of the stand is formed with an upper mother board supporting surface 48. The base portion is also provided with an optional mounting screw hole 49 which may be used in lieu of the slot and keyway arrangement.

Means on the stands 30 for removably supporting the board 22 in spaced relation to the base 20 includes a pair of opposite deflectable fingers 50. The fingers 50 are formed as an integral part of the upper body portion 42 and extend downwardly and outwardly and terminate a short distance above the surface 48 of the base portion 40. In fact, the fingers 50 terminate at a distance from the surface 48 which is approximately to the thickness of the mother board 22.

The openings 35 in the board 22 have a diameter which permits these boards to be readily received over the body portion 42 and yet are sufficiently small to cause inward deflection of the fingers 50 as the board 22 is pressed downwardly over the stands 30, as shown progressively in FIGS. 8 and 9. Accordingly, the fingers 50 are first deflected inwardly as shown in FIG. 9 followed by outward locking movement to their original position as the board 22 clears the fingers 50 and comes to rest on the surface 48 of the base portion 40. In this position it will be seen that the stands 30 provide an insulated stand-off for the mother board 22 with respect to the base 20. Even though a number of pairs of the stands 30 may be used, corresponding to the number of daughter board positions to be provided, the mother board may be assembled and locked into positon without difficulty due to the ability of the support stands 30 to align themselves on the base 20.

Figure 2:
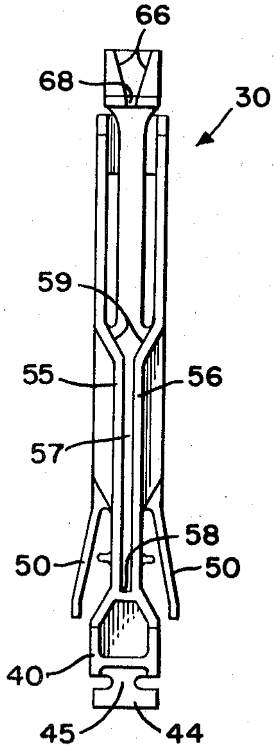
FIG. 2 is a front elevation of one of the stands.
Figure 3:
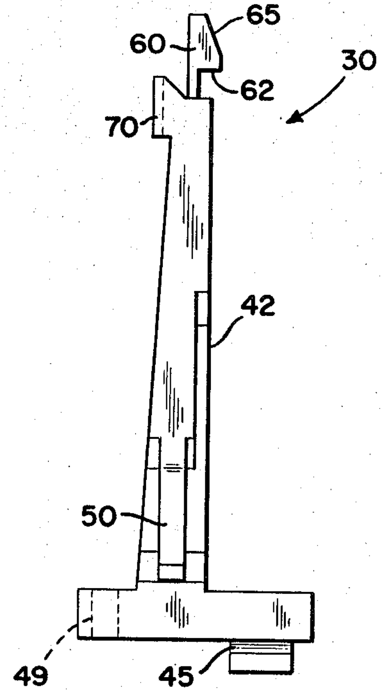
FIG. 3 is a side elevation thereof.
Figure 4:
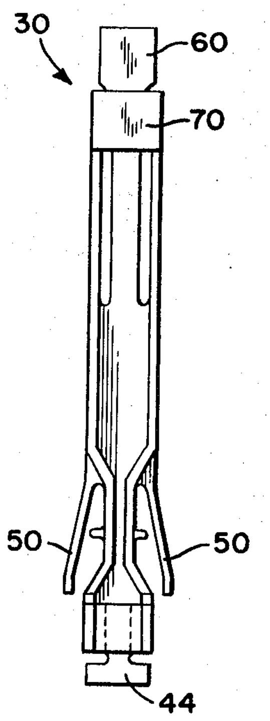
FIG. 4 is a back elevation thereof.

The support stands 30 include means for removably supporting a daughter board 25. For this purpose, the stands are arranged in inwardly facing pairs as shown in FIG. 1 and as illustrated by the pairing of the openings 32 in the base plate 20 of FIG. 5. For this purpose, the upper body portion 42 is provided with guide means formed by a pair of spaced apart side walls 55 and 56 defining therebetween a vertical slot 57 terminating at a bottom ledge 58 as shown in FIG. 2. Tapered walls 59 lead into the slot 57. The slot 57 is proportioned in width to receive a vertical edge of the board 25, while the ledge 58 defines the bottom inserted position of the board 25.

The support stands further include means for locking the daughter board in place including an outwardly deflectable arm 60 which has a lower ledge surface 62 at its upper end engageable with the upper edge of the board 25 when fully inserted within the guide means 57. Further, the arm 60 has a transversely tapered front surface 65 and is also provided with tapered lead in surfaces 66 terminating at a slot 68. The slot 68 provides further support for the inserted board 25.

As mentioned above, a pair of the stands is used for each daughter board to be accommodated and are positioned on the base 20 in such a manner that the board-receiving slots 57 and 68 are mutually inwardly directed over the mother board 22. When it is desired to insert a daughter board it is merely necessary to press it downwardly between the stands resulting in the outward deflection of the arms 60 as shown in FIG. 13. When the board is seated, the arms 60 spring back into its original position, bringing the ledges 62 over the opposite upper edges of the board, as shown for one board in FIG. 14. The stands 30 are further provided with a backstop 70 to prevent the arms from being over extended and broken in use.

The stands 30 accordingly provide means for supporting the daughter boards 25 in mutually perpendicular or normal relation to the board 22. Preferably, a terminal edge connector 72, mounted on the mother board, is employed to make electrical contact between the board 25 and the board 22. Again, the assembly of the boards 25 and their retention is accomplished without the use of mounting screws or other fasteners, and the boards 25 may be easily removed by retracting the arms 60 and withdrawing the boards 25. The connector 72 can be mounted other than on a mother board, thus the stands are useful independently of their function as a mount for mother boards.

It is accordingly seen that this invention provides support stands which position a primary circuit board on a base and which provides insulated stand-off, without fasteners. They also provide fastenerless support for secondary boards as may be desired to provide circuit functions added to or separate from the primary board. They assure proper and accurate assembly and registration of the parts with a minimum of time and labor involved.

While the forms of apparatus herein described constitute preferred embodiments of the invention, it is to be understood that the invention is not limited to these precise forms of apparatus, and that changes may be made therein without departing from the scope of the invention which is defined in the appended claims.

What is claimed is:

1. In a printed circuit including a support base, a mother printed circuit board and at least one daughter printed circuit board, the combination comprising at least two printed circuit support stands, said stands being formed essentially of non-conducting material and having a base portion adapted to be mounted on said support base and having an upstanding body portion, means mounting a pair of said stands on said base at the base portion thereof in spaced apart relation, a pair of deflectable fingers integral with said body portion and extending downwardly and outwardly therefrom terminating in free ends adjacent said base portion, means on said mother board defining an aperture for each of said stands, the diameter of said apertures being such as to be readily received over said upstanding body portions yet sufficiently small to cause inward deflection of said fingers when said mother board is passed downwardly around said body portion onto said base portion followed by outward locking movement thereof as said mother board clears said fingers and comes to rest on said base portion, means on each said body portion defining a daughter board-receiving slot with the slots of each pair of stands being mutually inwardly directed over said mother board, said daughter board being receivable on said stands in said slots in perpendicular relation to said mother board, arm means integrally connected to said body portion above said slots and having a deflectable ledge surface engageable with said daughter board to retain said daughter board in said slots, and connector means electrically connecting said daughter board to said mother board.

2. A stand for supporting printed circuit boards in spaced relation to a backing plate, comprising a stand having a unitary body formed of plastic material including a base portion defining an upper primary circuit board support surface, means mounting said stand on said plate with said surface spaced above said plate to provide a stand-off distance for a primary circuit board, an upper portion of said body extending upwardly from said base portion, said upper portion having retainer fingers with free lower ends adapted to engage and retain a primary circuit board in superimposed relation on said surface, vertically extending guide means in said upper portion adapted to receive one vertical edge of a secondary circuit board, means on said upper portion adapted to engage and retain such secondary circuit board in said guide means in perpendicular relation to such primary circuit board, said retainer fingers extending downwardly and outwardly and being inwardly deflectable terminating slightly above said base surface a distance approximately equal to the thickness of such primary board, said upper body portion adapted to be threaded through an aperture in such primary board by said inward deflection of said fingers to permit seating thereof on said surface followed by outward deflection thereof above said primary board to retain said primary board on said surface.

3. The stand of claim 2 wherein said secondary board retaining means comprises an outwardly deflectable arm having an upper end engageable with an upper edge of said secondary board when the same is inserted in said guide means.

* * * * *